United States Patent [19]

Shreve et al.

[11] 4,310,867
[45] Jan. 12, 1982

[54] VOLTAGE RESPONSIVE SWITCH WITH INPUT VOLTAGE SURGE PROTECTION

[75] Inventors: John R. Shreve, Kokomo; Wesley A. Vincent, Bringhurst, both of Ind.

[73] Assignee: General Motors Corporation, Detroit, Mich.

[21] Appl. No.: 191,360

[22] Filed: Sep. 29, 1980

[51] Int. Cl.³ ................... H02H 3/20; H03K 5/153
[52] U.S. Cl. ........................ 361/90; 307/362
[58] Field of Search ........... 361/90, 91, 92, 56; 307/362, 350, 290; 330/207 P, 298

[56] References Cited
U.S. PATENT DOCUMENTS 3,493,782  2/1970  Georgi ..................... 307/362
3,628,059  12/1971  Niu ........................ 307/362
3,675,045  7/1972  Mullaly ..................... 307/362
3,725,673  4/1973  Frederiksen et al. ............ 307/362

Primary Examiner—J. D. Miller
Assistant Examiner—Reinhard J. Eisenzopf
Attorney, Agent, or Firm—Howard N. Conkey

[57] ABSTRACT

A high gain voltage responsive current source supplies emitter current to a lateral input PNP transistor in a monolithic integrated circuit voltage responsive switch and, in conjunction with an impedance between the voltage signal input terminal and base region of the input PNP transistor, protects the voltage responsive switch from negative voltage transients at the signal input terminal.

2 Claims, 1 Drawing Figure

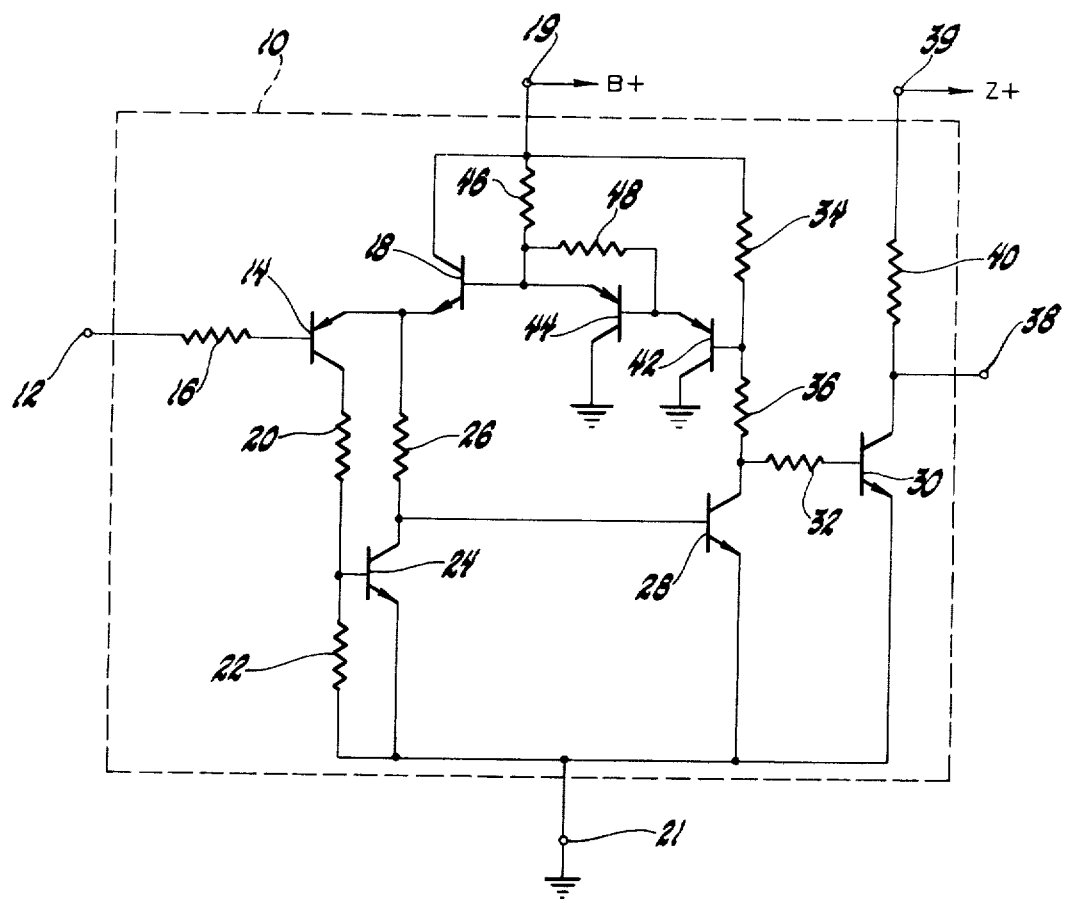

VOLTAGE RESPONSIVE SWITCH WITH INPUT VOLTAGE SURGE PROTECTION

Conventional monolithic integrated circuits, which are typically comprised of N-type epitaxial regions on a P-type substrate are extremely vulnerable to permanent damage by negative voltage transients which may forward bias the diodes formed by the P-type substrate and the N-type epitaxial layers. For example, if the input to an integrated circuit is the base region of a lateral PNP transistor, a negative voltage transient applied to the base region would forward bias the diode formed by the P-type substrate and the base region, which is an N-type pocket formed by P-type isolation regions in the epitaxial layer, since the P-type substrate is typically coupled to ground potential. The resulting high current may destroy the integrated circuit.

It is the general object of this invention to provide an improved monolithic integrated circuit voltage responsive switch having immunity to high level negative input transients.

It is another object of this invention to provide a switch as set forth in the foregoing object in which a voltage responsive high gain current source supplies emitter current to an input PNP transistor which cooperates with an input impedance for maintaining the diode formed by the integrated circuit substrate and epitaxial region reverse biased during high level negative input transients.

These and other objects of this invention may be best understood by reference to the single figured drawing which illustrates a monolithic integrated circuit voltage responsive switch having immunity to high level negative input transients in accord with the principles of this invention.

Referring to the FIGURE, there is illustrated the monolithic integrated circuit voltage responsive switch of this invention. The integrated circuit comprises a semiconductor body including N-type epitaxial regions formed on a P-type substrate and separated by P-type isolation barriers. The integrated circuit is identified as numeral 10 and includes an input terminal 12 coupled to the base region of a lateral PNP input transistor 14 through a resistor 16. The resistor 16 must be floating within its own epitaxial region on the integrated circuit or its epitaxial region may be connected to the same potential as the base of transistor 14, to prevent the epitaxial region from becoming forward biased during high level negative input transients. The lateral PNP transistor 14 has emitter and collector regions which are two separate P-type islands disposed within an N-type epitaxial region which forms the base region. The P-type substrate is coupled to the most negative potential (ground potential in this embodiment) so as to maintain the diode junctions formed by the P-type substrate and the N-type epitaxial regions reverse biased.

The emitter region of the PNP transistor 14 is coupled to the emitter region of an NPN transistor 18 which functions as a voltage responsive high gain current source. The collector region of the transistor 18 is coupled to a voltage supply terminal 19 which is coupled to a positive supply potential B+.

The collector region of the input transistor 14 is coupled to a grounded or negative supply terminal 21 through series coupled resistors 20 and 22. The junction between the resistors 20 and 22 is coupled to the base region of an NPN transistor 24 whose emitter region is coupled to the terminal 21 and whose collector region is coupled to the emitter region of the transistor 18 through a resistor 26.

The conduction state of the NPN transistor 24 controls the conduction state of an NPN transistor 28. In this respect, the collector region of the transistor 24 is coupled to the base region of the transistor 28 whose emitter region is coupled to the grounded terminal 21. The NPN transistor 28 in turn controls the conduction state of an output NPN transistor 30. This is accomplished by the connection of the collector region of the transistor 28 to the base region of the transistor 30 through a resistor 32.

The transistor 30 is biased conductive by current supplied to its base region from the B+ supply terminal 19 through a series combination of the resistor 32 and resistors 34 and 36 when the transistor 28 is off. When the transistor 28 is on, the current through the resistors 34 and 36 is bypassed to ground and the transistor 30 is biased nonconductive.

The output of the voltage responsive switch 10 at the collector region of the transistor 30 is applied to an output terminal 38. The output terminal is also coupled through a resistor 40 to a regulated voltage supply terminal 39 that in turn is coupled to a regulated voltage source Z+ so that when the transistor 30 is biased off, the regulated voltage at the terminal 39 is applied to the output terminal 38. However, when the transistor 30 is biased conductive, the output terminal 38 is near ground potential.

A reference voltage determining the switch point of the voltage responsive switch is generated by the series coupled resistors 32, 34, 36 and the forward base-emitter voltage of transistor 30 with the resistor 32 being switched in and out of the series circuit by the transistor 28 to provide for hysteresis in the switch point of the voltage responsive switch. The reference voltage provided by the series circuit is applied to the base region of a PNP transistor 42 from between the junction of the resistors 34 and 36. The collector region of the transistor 42 is grounded and the emitter region thereof is coupled to the base region of a PNP transistor 44. The collector region of the transistor 44 is grounded and the emitter region thereof is coupled to the base region of the transistor 18 and to the positive supply terminal 19 through a resistor 46. A resistor 48 is coupled between the emitter and base regions of the transistor 44.

In operation, when the input voltage to the input terminal 12 is at ground, base current is drawn from the transistor 14 biasing it on. The collector current of the transistor 14 limited by the resistor 20 flows through the resistor 22 and into the base region of the transistor 24 turning the transistor 24 on. Transistor 24 in turn sinks all of the current supplied through the resistor 26 from the transistor 18 and consequently maintains the transistor 28 biased off. Therefore, current flows from the positive voltage source B+ applied to the terminal 19 through the resistors 34, 36 and 32 and into the base region of the output transistor 30 turning it on. The output signal at the output terminal 38 is therefore near ground potential when the input signal to the input terminal 12 is low. In this state, the reference voltage at the base region of the transistor 42 is determined by the voltage divider formed by the resistors 32, 34, 36 and the base-emitter voltage of the transistor 30 and in this embodiment is set to be approximately equal to two-thirds of the supply voltage B+ at the terminal 19. The resulting voltage at the base region of the transistor 18 is greater than the reference voltage by the base-emitter voltage drops of the transistors 42 and 44. The voltage at the base region of the transistor 14 is two base-emitter voltage drops less than the voltage at the base region of the transistor 18 so that the voltage at the base region of the transistor 14 is equal to the reference voltage. The transistors 42 and 44 provide with their own base-emitter voltages, temperature compensation for the base-emitter voltages of the transistors 14 and 18.

As the voltage applied to the input terminal 12 increases to a value greater than the reference voltage, the base current of the transistor 14 is reduced to zero thereby turning off the input transistor 14 and the transistor 24. The current supplied through the resistor 26 by the transistor 18 thereby flows into the base region of the transistor 28 turning it on, which in turn biases the output transistor 30 off. The voltage at the output terminal 38 therefore rises to the regulated voltage value Z+ applied to the terminal 39, which voltage comprises the second output state of the voltage responsive switch.

When the circuit is in this state, the transistor 28 essentially shorts the resistor 32 in the voltage divider thereby providing a new resistor voltage divider comprised of the resistors 34 and 36. This new divider imposes a new lower reference voltage at the base of the transistor 42 which, in this embodiment is equal to one-third of the supply voltage B+. As previously described, this voltage is translated to the base region of the transistor 14 and is now the lower threshold which the input must go below in order to cause the circuit to change states again. This change in reference at the base region of the transistor 42 provides hysteresis in the switching of the voltage responsive switch which is equal to one-third of the supply voltage B+. As can be seen, since the upper and lower switch points are set by a voltage divider tied to the supply voltage B+, the hysteresis thresholds and hence the percentage of the hysteresis are ratiometric to the voltage supply B+.

The voltage responsive switch has a high immunity level to positive voltage transients as the input of the switch is the base region of a PNP transistor having a large breakdown voltage in the order of 40–60 volts or higher. Further and in accord with this invention, the circuit has a high level of immunity to negative input voltage transients at the input terminal 12 which is the base region of a P resistor having a large negative breakdown voltage in the order of 40 to 60 volts or higher. As previously indicated, monolithic integrated circuits cannot tolerate high level negative input transients since a negative input transient may forward bias the diode formed by the P-type substrate and the N-type epitaxial layer resulting in high current and permanent damage to the integrated circuit. For example, with respect to the transistor 14, a negative voltage at its base region, which is an isolated region of the epitaxial layer, forward biases the diode function formed with the P-type substrate upon which the epitaxial layer is formed. In the voltage responsive switch illustrated in the drawing, the NPN transistor 18 functions as a high gain voltage responsive current source which, in conjunction with the resistor 16, tends to maintain the voltage at the base region of the transistor 14 equal to the reference voltage applied to the base region of the transistor 42. As the negative transient at the input terminal 12 tends to lower the base voltage at the base region of the transistor 14, the resulting decrease in the voltage at the emitter region of the transistor 18 biases the transistor 18 further conductive to increase the current supplied to the emitter of the transistor 14 to tend to maintain the voltage at the base region of the transistor 14 constant and equal to the reference voltage. Because of the high current gain configuration of the transistor 18 and the base impedance 16, the voltage responsive switch 10 is immune to large negative voltage transients at the input terminal 12 by maintaining the voltage at the base region positive to maintain the substrate-epitaxial layer diode reverse biased.

The foregoing description of a preferred embodiment for the purposes of illustrating the invention is not to be considered as limiting or restricting the invention since many modifications may be made by a person skilled in the art without departing from the scope of the invention.

The embodiments of the invention in which an exclusive property or privilege is claimed are defined as follows:

1. A monolithic integrated circuit voltage responsive switch having input voltage transient protection comprising, in combination:

positive and negative voltage supply terminals;
    input and output terminals;
    a PNP transistor having base, emitter and collector regions;
    means including a resistance element effective to couple the input terminal to the base region of the PNP transistor;
    means effective to generate a switching level reference voltage;
    a high gain voltage responsive current source responsive to the difference between the reference voltage and the voltage at the base region of the PNP transistor when the voltage at the input terminal decreases below the reference voltage effective to supply emitter current to the emitter region of the PNP transistor; and
    output circuit means responsive to the conduction state of the PNP transistor effective to supply a bi-level output signal to the output terminal in accord with the relationship between the input voltage at the input terminal and the reference voltage, the high gain voltage responsive current source and the resistance element tending to maintain the voltage at the base region of the PNP transistor at the switching level reference voltage to prevent the base region of the PNP transistor from becoming more negative than the negative voltage supply terminal in response to a negative voltage transient at the input terminal to thereby prevent damage to the monolithic integrated circuit voltage responsive switch in response to the negative voltage transient.

2. A monolithic integrated circuit voltage responsive switch having a semiconductor body including a P-type substrate and N-type epitaxial regions isolated from each other by P-type isolation barriers, the voltage responsive switch comprising, in combination:

positive and negative voltage supply terminals;
    input and output terminals;
    a lateral PNP transistor having base emitter and collector regions incorporated in one of the epitaxial regions;
    a reference supply circuit including an NPN transistor having a collector and an emitter coupled between the emitter of the PNP transistor and the positive supply terminal and having a base, the reference circuit further including means effective to generate a reference voltage and means coupling said reference voltage to the base of the NPN transistor, the NPN transistor comprising a high gain voltage responsive current source responsive to the base voltage of the PNP transistor;

means including a resistance element effective to couple the input terminal to the base of the PNP transistor; and output circuit means coupled with the output terminal effective to provide a two state output signal at the output terminal in accord with the relationship between the input voltage at the input terminal and the reference voltage, the high current gain of the NPN transistor and the resistance element cooperating to maintain the P-N junction between the epitaxial region carrying the PNP transistor and the substrate reverse biased to prevent damage to the integrated circuit voltage responsive switch.

* * * * *